US 6,577,546 B2

(12) United States Patent
Fujiwara et al.

(10) Patent No.: US 6,577,546 B2
(45) Date of Patent: Jun. 10, 2003

(54) SEMICONDUCTOR INTEGRATED CIRCUIT AND OPERATING METHOD

(75) Inventors: Keisuke Fujiwara, Tokyo (JP); Sachiko Edo, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/939,869

(22) Filed: Aug. 27, 2001

(65) Prior Publication Data
US 2002/0041529 A1 Apr. 11, 2002

(30) Foreign Application Priority Data
Aug. 30, 2000 (JP) ........................................ 2000-261055

(51) Int. Cl.[7] ................................................. G11C 7/00
(52) U.S. Cl. .................................. 365/201; 365/189.05
(58) Field of Search .......................... 365/201, 189.05, 365/189.08, 230.02, 230.08

(56) References Cited

U.S. PATENT DOCUMENTS 5,710,737 A  *  1/1998  Komiya et al. ............. 365/193
5,761,215 A  *  6/1998  McCarthy et al. .......... 714/726
6,065,143 A  *  5/2000  Yamasaki et al. .......... 365/201

FOREIGN PATENT DOCUMENTS

JP  11-134900  5/1999
JP  11-260096  9/1999

OTHER PUBLICATIONS

English Bibliographies and Abstracts of JP 11–260096 and JP 11–134900 (noted above).

* cited by examiner

Primary Examiner—Richard Elms
Assistant Examiner—Anh Phung
(74) Attorney, Agent, or Firm—Darryl G. Walker; Bradley T. Sako

(57) ABSTRACT

A semiconductor integrated circuit (50) having normal operation mode and a burn-in mode is provided. The semiconductor integrated circuit (50) can include a memory (14) and a logic circuit (9). The memory (14) may operate in response to input signals (input<5:0>) when in the burn-in mode while the logic circuit (9) may operate in response to control signals generated in response to one of the input signals (input<0>) having a predetermined value when the semiconductor integrated circuit (50) operates in the burn-in mode. The memory (14) may operate in response to memory control signals generated by the logic circuit (9) when the semiconductor integrated circuit (50) operates in the normal operation mode. The logic circuit (9) may generate the memory control signals in response to values provided by input signals (input<5:0>). In this way, the logic circuit (9) and memory (14) may be tested in the burn-in mode without providing additional inputs.

19 Claims, 9 Drawing Sheets

| | stt0<i> | stt1<i> | stt2<i> | stt3<i> | stt4<i> | stt5<i> | stt6<i> | stt7<i> |
|---|---|---|---|---|---|---|---|---|
| 0 | 0 | 0 | 0 | 0 | 0 | 0 | 0 | 0 |
| 1 | 1 | 0 | 0 | 0 | 0 | 0 | 0 | 0 |
| 2 | 0 | 1 | 0 | 0 | 0 | 0 | 0 | 0 |
| 3 | 1 | 1 | 0 | 0 | 0 | 0 | 0 | 0 |
| 4 | 0 | 0 | 1 | 0 | 0 | 0 | 0 | 0 |
| 5 | 1 | 0 | 1 | 0 | 0 | 0 | 0 | 0 |
| 6 | 0 | 1 | 1 | 0 | 0 | 0 | 0 | 0 |
| 7 | 1 | 1 | 1 | 0 | 0 | 0 | 0 | 0 |
| 8 | 0 | 0 | 0 | 1 | 0 | 0 | 0 | 0 |
| ⋮ | | | | | | | | |
| 255 | 1 | 1 | 1 | 1 | 1 | 1 | 1 | 1 |

(Row label: The value held by status pointer)

FIG. 6

SEMICONDUCTOR INTEGRATED CIRCUIT AND OPERATING METHOD

TECHNICAL FIELD

The present invention relates generally to a semiconductor integrated circuit and operating method and more particularly a semiconductor device having a memory and logic circuit integrated in which a burn-in test may be simultaneously executed.

BACKGROUND OF THE INVENTION

As the operating speed of a microprocessor unit (MPU) increases, the system memory is also required to increase its operating speed. The system memory typically includes a dynamic random access memory (DRAM). If the operating speed of DRAM fails to increase along with the operating speed of the logic included in the MPU, the processing performance becomes limited by the operating speed of the DRAM. To solve this problem, a semiconductor integrated circuit has been developed in which a DRAM and logic are both integrally placed on the same semiconductor chip.

In a semiconductor device, a burn-in test is commonly performed after manufacturing in order to screen and eliminate initial latent defects (infant mortality). A burn-in test subjects the semiconductor device to stress by applying high temperature (e.g., 125° C.) and a power supply voltage above the rated voltage indicated by the specification in which the device is guaranteed to reliably operate.

It is desired, in semiconductor integrated circuit having DRAM and logic, to simultaneously apply stress to both the DRAM and logic circuits during the burn-in test, thus, reducing test time and decreasing costs.

Japanese Laid-Open Patent Publication No. Hei 11-134900 discloses a semiconductor integrated circuit capable of applying a burn-in test to both a memory and a logic circuit. Such a semiconductor integrated circuit is illustrated in FIG. 1.

Referring now to FIG. 1, a block schematic diagram of a conventional semiconductor integrated circuit is set forth and given the general reference character 101.

Conventional semiconductor integrated circuit 101 includes a DRAM 102 and a logic circuit 103.

Logic circuit 103 includes multiplexers (108 to 111). In the burn-in operation, a signal is externally input into logic circuit 103. Logic circuit 103 is operable in response to an external input signal during burn-in.

Conventional semiconductor integrated circuit 101 also includes a vector generator circuit 112 and a refresh counter and control circuit 106. During burn-in operation, DRAM 102 can receive addresses, instructions, and data necessary for the burn-in operation from vector generator circuit 112 and refresh counter and control circuit 106. In this way, DRAM 102 and logic circuit 103 can be made to operate independently and simultaneously, so that a burn-in time can be reduced.

Conventional semiconductor integrated circuit 101 also includes a multipexer 113. Through multipexer 113, vector generator 112 receives vector generation control signal MBICMD, write data initial values (DIN0 to DINn), data inversion control signal DININV, read signal LDRD, and write signal LDWT. Write data initial values (DIN0 to DINn) are signals that set the initial values of the write data. Data inversion control signal DININV, read signal LDRD, and write signal LDWT are signals for inputting a read/write command into vector generator circuit 112. Vector generator circuit 112 also receives a carry signal RCRY generated by refresh counter and control circuit 106.

Vector generator circuit 112 includes a column address generator circuit 114, a segment address generator circuit 115, a write data generator circuit 116, a function command generator circuit 117, and an address generation control circuit 118.

Column address generator circuit 114 generates column address signals (CA0 to CAn). Segment address generator circuit 115 generates segment address signals (S0 to Sn). Write data generator circuit 116 generates write data signals (D0 to Dn) based upon write data initial values (DIN0 to DINn) and write signal LDWT. Function command generator circuit 117 generates read signal RD and write signal WT.

DRAM 102 receives column address signals (CA0 to CAn), write data signal (D0 to Dn), read signal RD, write signal WT, vector generation initiation signal MBI, and segment address signals (S0 to Sn) from vector generator circuit 112.

An input circuit 104 is provided on an input side of DRAM 102. An output circuit 105 is provided on an output side of DRAM 102. DRAM 102 also includes refresh counter and control circuit 106 and segment address decoder 107. Refresh counter and control circuit 106 generates a refresh signal and includes an address counter for generating a row address for selecting a row or word line to refresh.

Segment address decoder 107 selects one segment among four memory segments (not shown) provided on DRAM 102 based on segment address signals (S0 to Sn).

Conventional semiconductor integrated circuit 101 further includes logic circuit 103. As previously mentioned, logic circuit 103 includes multiplexers (108 to 111). Multiplexers (108 and 109) are provided on an input side front stage of input circuit 104 of DRAM 102. Multiplexers (108 and 109) each receive an input signal from input terminals (IN1 to INn), respectively and another signal from within logic circuit 103. Multiplexers (110 and 111) are provided on an output side next stage of output circuit 105 of DRAM 102. Multiplexers (110 and 111) each receive an output signal from DRAM 102 and a signal from within logic circuit 103 and generate signals at output terminals (OUT1 to OUTn), respectively.

During burn-in operation, vector generator circuit 112 and refresh counter and control circuit 106 generates addresses, instructions, and data for operating DRAM 102 based upon vector generation control signal MBICMD, write data initial values (DIN0 to DINn), data inversion control signal DININV, read signal LDRD, and write signal LDWT. DRAM 102 is operated in accordance with those addresses, instructions, and data during the burn-in operation.

Along with a test mode signal TM, logic circuit 103 is also operated in response to vector generation control signal MBICMD, write data initial values (DIN0 to DINn), data inversion control signal DININV, read signal LDRD, and write signal LDWT during burn-in operation.

In this way, DRAM 102 and logic circuit 103 are simultaneously operated during burn-in operation and burn-in test time is shortened.

As described above, in a burn-in operation of conventional semiconductor integrated circuit 101, extra input signals may be needed. However, the greater the number of input signals, the more input/output pins are required in a semiconductor integrated circuit. A burn-in apparatus or tester can be limited by the number of input/output pins. This can be due to limited bandwidth, as just one example. During a burn-in test, many devices may be tested in parallel. By having a large number of functioning input/output pins per device, the bandwidth of the tester can be limited because it may not be desirable to test too many devices in parallel being controlled by the same signal lines due to increased loads and tester limitations.

Thus, it is desirable that the number of input signals needed in a burn-in test be reduced. This can allow costs to be decreased by allowing a larger number of semiconductor integrated circuits to be tested simultaneously.

Also, when a large number of input signals are used, such as in a conventional semiconductor integrated circuit, a large number of test patterns of input signals is increased and complexity is increased. This can increase test time and cost. It is preferable to reduce the number of patterns in order to decrease cost.

In view of the above discussion, it would be desirable to provide semiconductor device which may be capable of executing a burn-in operation in a memory and a logic circuit simultaneously without increasing the number of input signals inputed from the outside.

SUMMARY OF THE INVENTION

According to the present embodiments, a semiconductor integrated circuit having a normal operation mode and a burn-in mode is provided. The semiconductor integrated circuit may include a memory and a logic circuit. The memory may operate in response to input signals when in the burn-in mode while the logic circuit may operate in response to control signals generated in response to one of the input signals having a predetermined value when the semiconductor integrated circuit operates in the burn-in mode. The memory may operate in response to memory control signals generated by the logic circuit when the semiconductor integrated circuit operates in the normal operation mode. The logic circuit may generate the memory control signal in response to values provided by the input signals. In this way, the logic circuit and memory may be tested in the burn-in mode without providing additional inputs.

According to one aspect of the embodiments, a semiconductor integrated circuit may have a burn-in mode and an ordinary operation mode. The semiconductor integrated circuit may include a memory operable in response to a plurality of input signals when the semiconductor integrated circuit is in the burn-in mode. A logic generator circuit may provide control signals in response to at least one of the plurality of input signals when the semiconductor integrated circuit is in the burn-in mode. A logic circuit may operate in response to the control signals.

According to another aspect of the embodiments, when the semiconductor integrated circuit is in the ordinary operation mode, the logic generator circuit may provide control signals having logic values dependent on the logic value of the plurality of input signals. The logic circuit may provide at least one memory control signal in response to the control signals. The memory may be operated in response to the at least one memory control signal.

According to another aspect of the embodiments, the semiconductor integrated circuit may include a pattern detection circuit coupled to receive the plurality of input signals. The pattern generator circuit may generate a logic circuit enable signal having a logic circuit enable state and a logic circuit disable state. During the normal operation mode, the logic circuit enable signal may have the logic circuit enable state in response to the pattern detection circuit detecting a predetermined pattern included in the plurality of input signals.

According to another aspect of the embodiments, the logic circuit enable signal may have the logic circuit enable state when the semiconductor integrated circuit is in the burn-in mode.

According to another aspect of the embodiments, the plurality of input signals may be digital signals, each having a logic value. When the semiconductor integrated circuit is in the burn-in mode, the logic generator circuit may periodically detect the logic value of at least one of the plurality of input signals and may change the logic value of the control signals if the logic value of at least one of the plurality of input signals is a predetermined logic value.

According to another aspect of the embodiments, the logic circuit may include a pattern generator, that may change the logic value of the control signals if the logic value of a predetermined on of the plurality of input signals has the predetermined logic value.

According to another aspect of the embodiments, a method of operating a semiconductor integrated circuit capable of operating in a burn-in mode and an ordinary operation mode may include the steps of receiving an input signal, operating a memory in response to the input signal during the burn-in mode, generating a logic circuit operation signal based on the input signal during the burn-in mode, and operating a logic circuit in response to the logic circuit operation signal.

According to another aspect of the embodiments, the method of operating the semiconductor integrated circuit may include the steps of generating a logic circuit control signal having a value substantially the same as the value of the input signal during the ordinary operation mode, operating the logic circuit in response to the logic circuit control signal and outputting a memory control signal, and operating the memory in response to the memory control signal.

According to another aspect of the embodiments, the method of operating the semiconductor integrated circuit may include the steps of generating a logic circuit allowance signal for instructing whether or not operation of the logic circuit is allowed.

According to another aspect of the embodiments, the step of generating the logic circuit allowance signal may include the steps of generating the logic circuit allowance signal such that operation of the logic circuit is allowed during the burn-in mode, detecting whether or not a predetermined pattern is included in the input signal during the ordinary operation mode, generating the logic circuit allowance signal such that operation of the logic circuit is allowed when the predetermined pattern is included in the input signal during the ordinary operation mode, and generating the logic circuit allowance signal such that operation of the logic circuit is prohibited when the determined pattern is not included in the input signal during the ordinary operation mode.

According to another aspect of the embodiments, a semiconductor integrated circuit may include a stress test mode and an ordinary operation mode. The semiconductor integrated circuit may include a memory circuit operable in response to a group of inputs signals when the semiconductor integrated circuit is in the stress test mode. A logic generator circuit may provide control signals in response to at least one of the inputs signals from the group of inputs signals when the semiconductor integrated circuit is in the stress test mode. A logic circuit may operate in response to the control signals.

According to another aspect of the embodiments, the logic generator circuit may include a trigger bit detection circuit providing a trigger signal in response to at least one of the input signals from the group of input signals. The logic generator circuit may modify a logic value of at least one of the control signals in response to the trigger signal when the semiconductor integrated circuit is in the stress test mode.

According to another aspect of the embodiments, the logic generator circuit may include a pattern generator circuit generating the control signals in response to the trigger signal when the semiconductor integrated circuit is in the stress test mode.

According to another aspect of the embodiments, the pattern generator circuit may include a status pointer circuit that increments a stored status value in response to the trigger signal when the semiconductor integrated circuit is in the stress test mode.

According to another aspect of the embodiments, the semiconductor integrated circuit may include a pattern detection circuit that generates a pattern hit signal having a pattern detected state in response to the group of input signals having a predetermined pattern when the semiconductor integrated circuit is in the ordinary operation mode and when the pattern hit signal has the pattern detected state the logic circuit is allowed to operate in response to the control signals.

According to another aspect of the embodiments, the pattern signal may have the pattern detected state regardless as to whether the group of input signals has the predetermined pattern when the semiconductor integrated circuit is in the stress test mode.

According to another aspect of the embodiments, the group of input signals may provide data in a serial fashion. The logic circuit may include a serial to parallel conversion circuit that converts the group of input signals into parallel signals to provide the control signals when the semiconductor integrated circuit is in the ordinary operation mode.

According to another aspect of the embodiments, the logic circuit may provide memory control signal when the semiconductor integrated circuit is in the ordinary operation mode.

According to another aspect of the embodiments, the semiconductor integrated circuit may include a first test mode. The logic circuit may be disabled in the first test mode. The memory circuit may be operable in response to the group of input signals when the semiconductor integrated circuit is in the first test mode.

According to another aspect of the embodiments, the stress test mode may be a burn-in test mode.

BRIEF DESCRIPTION OF THE DRAWINGS

FIG. 6 is a table illustrating the logic level of status signals based on a value held by a status pointer according to an embodiment.

DETAILED DESCRIPTION OF THE EMBODIMENTS

Various embodiments of the present invention will now be described in detail with reference to a number of drawings.

Figure 1:
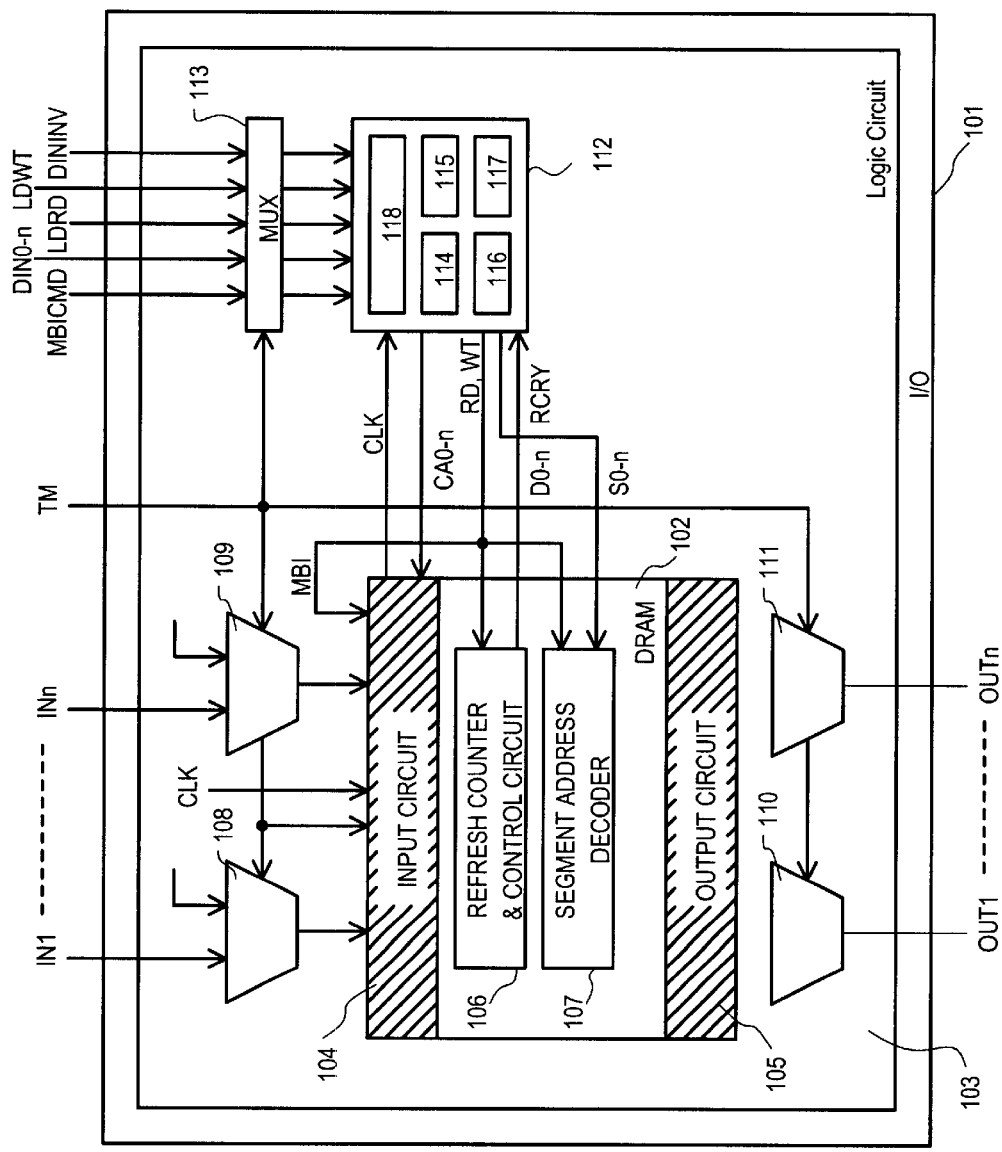
FIG. 1 is a block schematic diagram of a conventional semiconductor integrated circuit.
Figure 2:
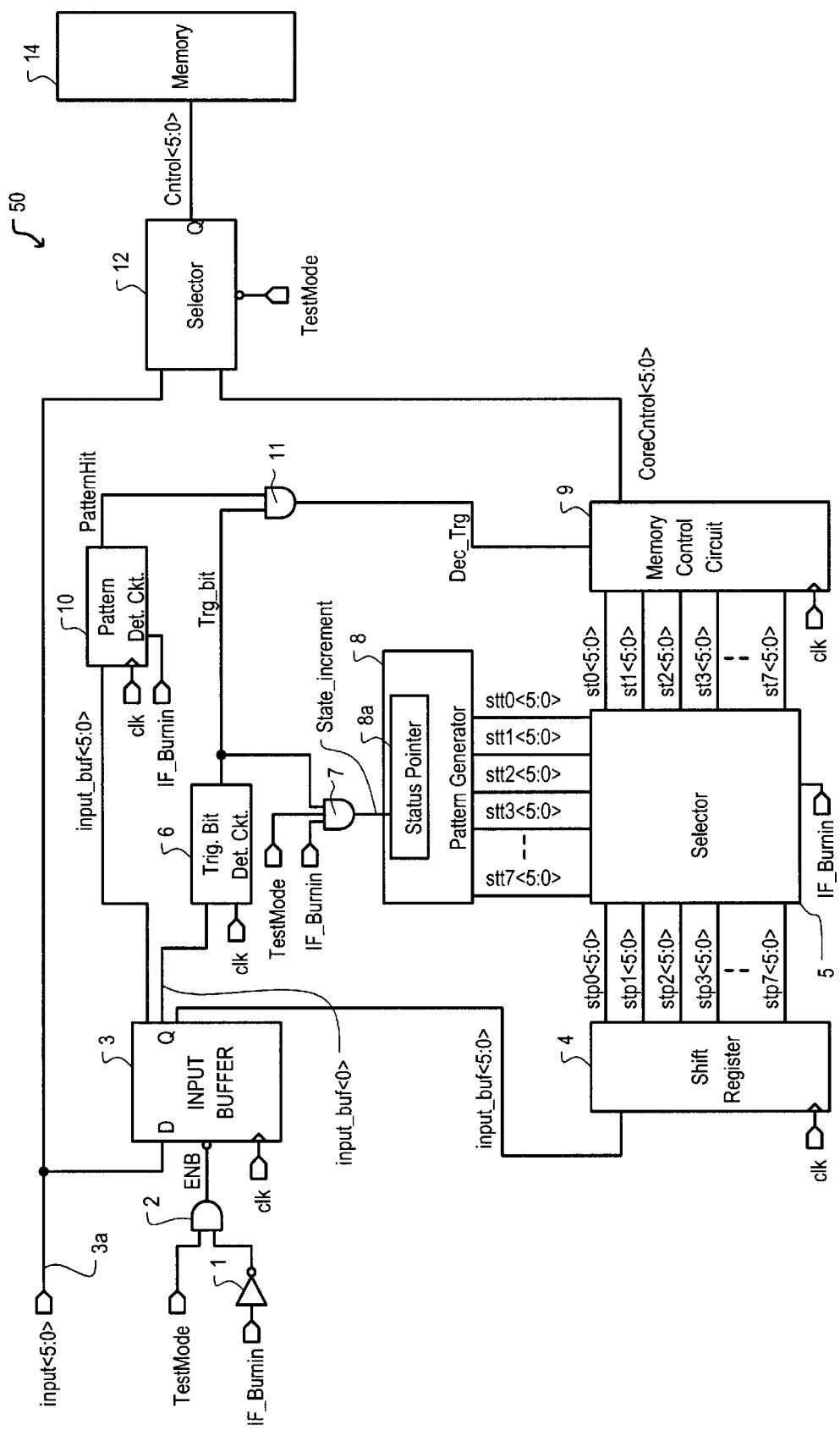
FIGS. 2 is a block schematic diagram of a semiconductor integrated circuit according to one embodiment.

Referring now to FIG. 2, a block schematic diagram of a semiconductor integrated circuit according to one embodiment is set forth and given the general reference character 50.

Semiconductor integrated circuit 50 may include an inverter 1, AND gates (2, 7, and 11), an input buffer 3, a shift register 4, a selector 5, a trigger bit detection circuit 6, a pattern generator 8, a memory control circuit 9, a pattern detection circuit 10, a selector 12, and a memory 14.

Inverter 1 may receive a signal IF_Burnin as an input and may provide an output to AND gate 2. AND gate 2 may receive signal IF_Burnin and a signal TestMode as inputs and may provide a signal ENB to input buffer 3. Input buffer 3 may receive signal ENB, signal group input<5:0> and a clock signal clk as inputs.

Signal group input<5:0> may include a group of six signals (input<0>, input<1>, input<2>, input<3>, input<4>, and input<5>). Hereafter, the group of six signals (input<0> to input<5>) may be expressed as signal group input<5:0> for simplicity.

Likewise, any other arbitrary signal groups, for example signal group A<n:0>, may be a group of n signals (A<0>, A<1>, A<2>, A<3>, A<4>, ..., input<n>). One arbitrary signal among signal group A<n:0> may be expressed as signal A<I>, where I is an integer from 0 to n. This notation may be applied to other signals.

Input buffer 3 may output signal group input_buf<5:0>. Signal group input_buf<5:0> may include signals (input_buf<0> to input_buf<5>).

Shift register 4 may receive signal group input_buf<5:0> and clock signal clk as inputs. Shift register 4 may output status signal group (stp0<5:0>, stp1<5:0>, stp7<5:0>) to selector 5. Status signal group stp0<5:0> may include status signal (stp0<0> to stp7<5>). Likewise, status signal group stpj<5:0> may include status signal (stpj<0> to stpj<5>), where j may be an integer from 0 to 7.

Signal input_buf<0> from signal group input_buf<5:0> may be received by trigger bit detection circuit 6. Also, trigger bit detection circuit 6 may receive clock signal clk and may produce signal Trg_Bit, which may be input into AND gate 7.

AND gate 7 may also receive signal TestMode and signal IF_Burnin. AND gate 7 may produce a signal State_increment. Pattern generator 8 may receive signal State_increment. Pattern generator 8 may include a status pointer 8a. Pattern generator 8 may produce status signal group (stt0<5:0> to stt7<5:0>), which may be received by selector 5. Status signal group stt0<5:0> may include status signal (stt0<0> to stt0<5>). Likewise, status signal group sttj<5:0> may include status signal (sttj<0> to sttj<5>), where j may be an integer from 0 to 7.

Selector 5 may receive status signal group (stp0<5:0> to stp7<5:0>), status signal group (stt0<5:0> to stt7<5:0>), and signal IF_Burnin as inputs and may generate status signal group (st0<5:0> to st7<5:0>) as outputs. Memory control circuit 9 may receive status signal group (st0<5:0> to st7<5:0>) as inputs. Status signal group st0<5:0> may include status signal (st0<0> to st0<5>). Likewise, status signal group stj<5:0> may include status signal (stj<0> to stj<5>), where j may be an integer from 0 to 7.

Pattern detection circuit 10 may receive signal group input_buf<5:0>, signal IF_Burnin, and clock signal clk as inputs and may generate signal PatternHit as an output.

AND gate 11 may receive signal PatternHit and signal Trg_bit is inputs and may generate signal Dec_Trg as an output.

Memory control circuit 9 may receive status signal group (st0<5:0> to st7<5:0>), signal Dec_Trg, and clock signal clk as inputs and may generate signal group CoreCntrol<5:0> as an output. Signal group CoreCntrol<5:0> includes signals (CoreCntrol<0> to CoreCntrol<5>).

Selector 12 may receive signal group input<5:0>, signal group CoreCntrol<5:0>, and signal TestMode as inputs and may generate signal group Cntrol<5:0> as an output. Memory 14 may receive signal group Cntrol<5:0> as an input. Signal group Cntrol<5:0> includes signals (Cntrol<0> to Cntrol<5>).

It is noted that another semiconductor integrated circuit (device) having a similar construction as that of semiconductor integrated circuit 50 may be electrically connected to receive signal group input<5:0> along signal line 3a. Signal group input<5:0> may have a different value to indicate that data or commands are being transmitted to a device other than semiconductor integrated circuit 50.

Next, the operation of semiconductor integrated circuit 50 according to the present embodiment will be described. Respective sections of semiconductor integrated circuit 50 may operate differently depending upon an ordinary operation mode, a test mode, or a burn-in mode.

An ordinary operation mode may be an operation mode that is set when semiconductor integrated circuit 50 executes an operation within operating conditions such as may have a guaranteed function and performance in accordance with a specification. When semiconductor integrated circuit 50 operates in the ordinary operation mode, a signal group for controlling memory control circuit 9 may be input by way of signal group input<5:0>. When semiconductor integrated circuit 50 operates in the ordinary operation mode, input buffer 3, shift register 4, and selector 5 may function to receive signal group input<5:0> in a serial fashion and output it in a parallel fashion to memory control circuit 9. Memory control circuit 9 may be substantially controlled by values receive from signal group input<5:0>. Memory control circuit 9 may output signal group CoreCntrol<5:0> for controlling memory 14. Memory 14 may operate in response to signal group CoreCntrol<5:0> in accordance with memory control circuit 9.

A test mode may be an operation mode that can be set when semiconductor integrated circuit 50 is tested. When semiconductor integrated circuit 50 is tested, signal group input<5:0> may be input for controlling memory 14. Memory 14 may operate in response to signal group input<5:0> for a predetermined test. In the test mode, memory control circuit 9 may not have a substantial effect on memory 14. When semiconductor integrated circuit 50 is operating in the test mode, only memory 14 may be operating and tested.

A burn-in mode may be an operation mode that can be set when semiconductor integrated circuit 50 is burned in. When semiconductor integrated circuit 50 is in the burn-in mode, memory control circuit 9 may be substantially controlled by values receive from signal group input<5:0> in a similar manner as in the test mode. When semiconductor integrated circuit 50 is in the burn-in mode, memory 14 may operate in response to signal group input<5:0> whereby burn-in stress may be applied.

In burn-in mode, input buffer 3, trigger bit detection circuit 6, and pattern generator 8 may collectively operate to generate status signal group (stt0<5:0> to stt7<5:0>) for operating memory control circuit 9. In this way, memory control circuit 9 may operate in response to status signal group (stt0<5:0> to stt7<5:0>).

When semiconductor integrated circuit 50 is in the burn-in mode, memory control circuit 9 may operate although signal group input<5:0> may be input for controlling memory 14 directly. Thus burn-in stress may also be applied to memory control circuit 9. More specifically, when semiconductor integrated circuit 50 is in the burn-in mode, memory control circuit 9 and memory 14 may simultaneously operate only by inputting signal group input<5:0> for controlling memory 14.

The operation mode of semiconductor integrated circuit 50 may be determined by signals (TestMode and IF_Burnin). When signal TestMode is low (ground), semiconductor integrated circuit 50 may operate in the ordinary operation mode. When signal TestMode is high (a power supply potential), and signal IF_Burnin is low, semiconductor integrated circuit 50 may operate in the test mode. When both signals (TestMode and IF_Burnin) are high, semiconductor integrated circuit 50 may operate in the burn-in mode.

Circuits of semiconductor integrated circuit 50 may have different operations depending on the logic levels of signals (TestMode and IF_Burnin).

The operation of various circuits of semiconductor integrated circuit 50 will now be described.

Referring once again to FIG. 2, inverter 1 may logically invert signal IF_Burnin and apply it to an input of AND gate 2. AND gate 2 may receive signal TestMode at another input. AND gate 2 may generate signal ENB as an output.

Signals (TestMode and IF_Burnin) may determine the operating mode of semiconductor integrated circuit 50. When signal TestMode is low, semiconductor integrated circuit 50 may operate in the ordinary operation mode. The ordinary operation mode may be an operation mode that is set when semiconductor integrated circuit 50 executes an operation within operating conditions such as may have a guaranteed function and performance in accordance with a specification.

When signal TestMode is high (a power supply potential), and signal IF_Burnin is low, semiconductor integrated circuit 50 may operate in the test mode. The test mode may be an operation mode that can be set when semiconductor integrated circuit 50 is tested.

When both signals (TestMode and IF_Burnin) are high, semiconductor integrated circuit 50 may operate in the burn-in mode. The burn-in mode may be an operation mode that can be set when semiconductor integrated circuit 50 is burned in.

Signal ENB may indicate whether input buffer 3 is enabled or disabled. When signal ENB is high, input buffer 3 may be disabled. When signal ENB is low, input buffer 3 may be enabled.

When semiconductor integrated circuit 50 is in the ordinary operation mode, both signals (TestMode and IF_Burnin) may be low. In this case, signal ENB is low. Thus, when semiconductor integrated circuit 50 is in the ordinary operation mode, input buffer 3 may be enabled and can be allowed to operate.

When semiconductor integrated circuit 50 is in the test mode, signal TestMode may be high and signal IF_Burnin may be low. In this case, signal ENB is high. Thus, when semiconductor integrated circuit 50 is in the test mode, input buffer 3 may be disabled and may not be allowed to operate.

When semiconductor integrated circuit 50 is in the burn-in mode, both signals (TestMode and IF_Burnin) may be high. In this case, signal ENB is low. Thus, when semiconductor integrated circuit 50 is in the burn-in mode, input buffer 3 may be enabled and can be allowed to operate.

Input buffer 3 may receive clock signal clk. Clock signal clk may be a periodic pulse signal having a predetermined frequency. Semiconductor integrated circuit 50 may operate in synchronism with the rising and falling edges of clock signal clk. Both the rising edge and falling edge may be referred to as pulse edges. Clock signal clk can include a periodic pulse edges having a predetermined period. A period between a repeating pulse edge in clock signal clk may be referred to as a clock period.

Figure 3:
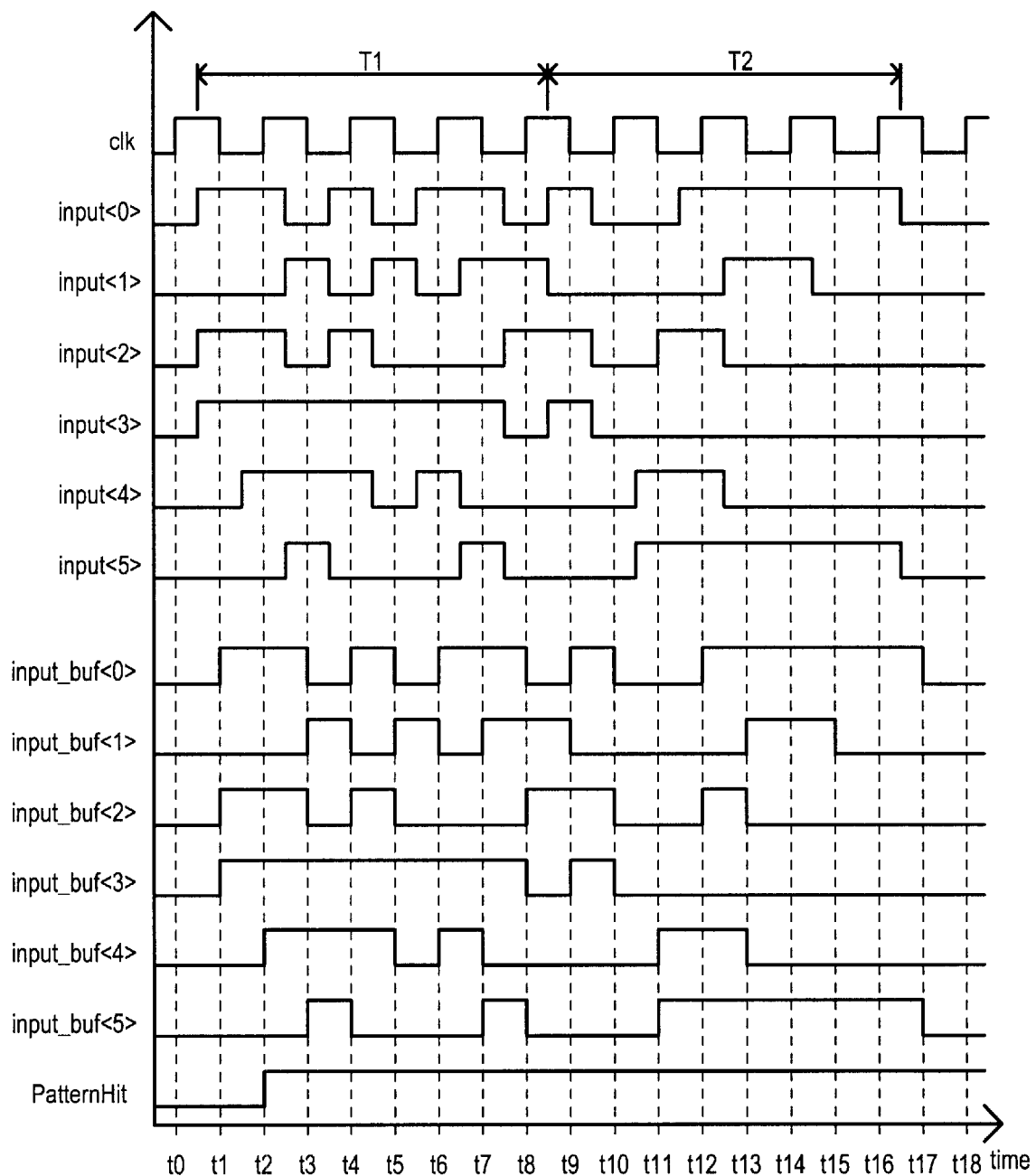
FIG. 3 is a timing diagram illustrating the operation of an input buffer and a pattern detection circuit according to an embodiment.

Referring now to FIG. 3, a timing diagram illustrating the operation of input buffer 3 and pattern detection circuit 10 according to an embodiment is set forth.

The timing diagram of FIG. 3 can include clock signal clk, signal group input<5:0>, signal group input_buf<5:0>, and signal PatternHit.

Referring now to FIG. 3 in conjunction with FIG. 2, input buffer 3 may receive signal group input<5:0> via signal line 3a. Signals (input<0> to input<5>) may be digital signal having logic high or logic low levels as illustrated in FIG. 3. Signals (input<0> to input<5>) may be received in synchronism with clock signal clk. Each of signals (input<0> to input<5>) may transmit one bit of information for every pulse edge.

When semiconductor integrated circuit 50 operates in the ordinary operation mode, signal group input<5:0> may control memory control circuit 9. The contents of signal group input<5:0> when semiconductor integrated circuit operates in the ordinary mode will now be described.

Signals (input<0> to input<5>) may transmit serial data. Successive 8 bits for signals (input<0> to input<5>) may constitute one packet. All signals (input<0> to input<5>) may transmit data for each packet. The head of the packet (first bits of information) may be indicated by signal input<0>. When signal input<0> is high, that clock edge and the subsequent seven clock edges may be used to receive the 8 bit length packet for each signal (input<0> to input<5>).

Referring to FIG. 3, signal input<0> is high at time t1. This can indicate the eight bits transmitted from time t1 may constitute one packet. A time interval from time t1 to time t8 is time interval T1. In that case, eight bits transmitted by signal input<0> for interval T1 may constitute one packet. Eight bits transmitted by signals (input<1> to input<5>) for interval T1 may also each constitute one packet.

After the completion of the transfer of data for the packet during time interval T1, at time t9, signal input<0> is high. This can indicate the eight bits transmitted from time t9 may constitute one packet. A time interval from time t9 to time t16 is time interval T2. In that case, eight bits transmitted by signal input<0> for interval T2 may constitute one packet. Eight bits transmitted by signals (input<1> to input<5>) for interval T2 may also each constitute one packet.

When semiconductor integrated circuit 50 operates in the test mode or burn-in mode, signal group input<5:0> may be input to control memory 14 directly through selector 12. In this case, signal group input<5:0> may transmit parallel data for controlling memory 14.

The operation of input buffer 3 may be different depending on the logic level of signal ENB. If semiconductor integrated circuit 50 is operating in the normal mode or burn-in mode, signal ENB is low and input buffer 3 is enabled. In this case, input buffer 3 may group signal input<5:0> every time a pulse edge of clock signal clk is detected. Input buffer 3 may latch signal input<0> as signal input_buf<0>. Likewise, input buffer 3 may latch signals (input<1> to input<5>) as signals (input_buf<1> to input_buf<5>), respectively.

Referring once again to FIG. 3, it can be seen that the waveforms of signals (input_buf<0> to input_buf<5>) may be synchronized with pulse edges of clock signal clk and may take the same logic values, respectively, as signals (input<0> to input<5>) have at the respective pulse edge in which they are synchronized. Signals (input_buf<0> to input_buf<5>) may also be transmitted in a serial manner.

However, if semiconductor integrated circuit 50 is in the test mode, signal ENB is at a high level. In this case, input buffer 3 may be disabled and may force signals (input_buf<0> to input_buf<5>) to be low. When semiconductor integrated circuit 50 is in the test mode, signal group (input_buf<0> to input_buf<5>) may not substantially transmit data. Also, when semiconductor integrated circuit 50 is in the test mode, shift register 4, selector 5, trigger bit detection circuit 6, AND gate 7, pattern generator 8, memory control circuit 9, pattern detection circuit 10, and AND gate 11 may all be disabled.

Shift register 4 may receive signal group input_buf<5:0> from input buffer 3. Shift register 4 may convert signal input_buf<0> included in signal group input_buf<5:0> to status signals (stp0<0>, stp1<0>, . . . , stp7<0>) as described below.

Figure 4:
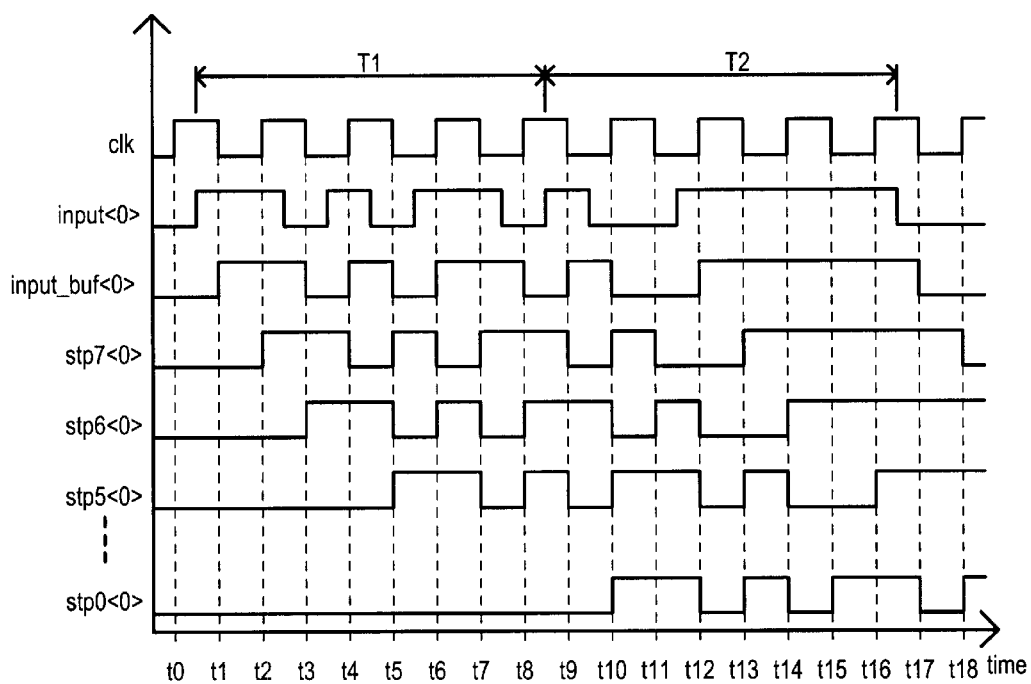
FIG. 4 is a timing diagram illustrating the operation of a shift register according to an embodiment.

Referring now to FIG. 4, a timing diagram illustrating the operation of shift register 4 according to an embodiment is set forth.

The timing diagram of FIG. 4 can include clock signal clk, signal input<0>, signal input_buf<0>, and status signals (stp7<0>, stp6<0>, stp5, . . . , stp0<0>).

Referring now to FIG. 4 in conjunction with FIG. 2, shift register 4 may incorporate data of signal input_buf<0> every time a pulse edge of clock signal clk is detected and may output it as status signal stp7<0>. In this way, status signal stp7<0> may delay data of signal input_buf<0> by one clock cycle (period between two edges of clock clk). Also, shift register 4 may delay data of signal input_buf<0> by another clock cycle and output it as status signal stp6<0>. Likewise, shift register 4 may delay data of signal input_buf<0> by another I clock cycles and output it as status signal stpJ<0>, where I may be an integer from zero to seven and J may be (7-I).

When semiconductor integrated circuit 50 operates in the ordinary operation mode, shift register 4 may serve to convert the serially transmitted data of signal group input_buf<5:0> to parallel data transmitted by status signal group stp0<5:0>.

When shift register 4 outputs a last bit in a packet transmitted by signal input_buf<0>, all data bits included in that packet may appear in status signals (stp0<0> to stp7<0>). The eight data bits included in a packet transmitted by signal input_buf<0> for time interval T1 may appear in status signals (stp0<0> to stp7<0>) from time t8 to t9 with signal stp7<0> having the end bit in the packet and signal stp0<0> having the start bit in the packet. In this way, serially transmitted data of signal group input_buf<5:0> to parallel data transmitted by status signal group stp0<5:0>.

Shift register 4 may operate in a similar manner for signals (input_buf<1> to input_buf<5>). Serial data transmitted in one packet of signal input_buf<1> may be converted to parallel data and may appear in status signals (stp0<1> to stp7<1>). Likewise, serial data transmitted in one packet of signal input_buf<I> may be converted to parallel data and may appear in status signals (stp0<I> to stp7<I>), where I may be an integer from zero to five.

When semiconductor integrated circuit 50 operates in the test mode, shift register 4 may not be enabled as described previously.

When semiconductor integrated circuit 50 operates in the burn-in mode, shift register 4 may operate in a similar manner as when semiconductor integrated circuit 50 operates in the ordinary operation mode.

Selector 5 may receive status signal group (stp0<5:0> to stp7<5:0>) output from shift register 4.

Trigger bit detection circuit 6 may receive signal input_buf<0> among signal group inputbuf<5:0> output from input buffer 3. Trigger bit detection circuit 6 may also receive clock signal elk. In this way, trigger bit detection circuit may receive input_buf<0> in synchronism with clock signal elk and generate signal Trg_Bit in response thereto.

Figure 5:
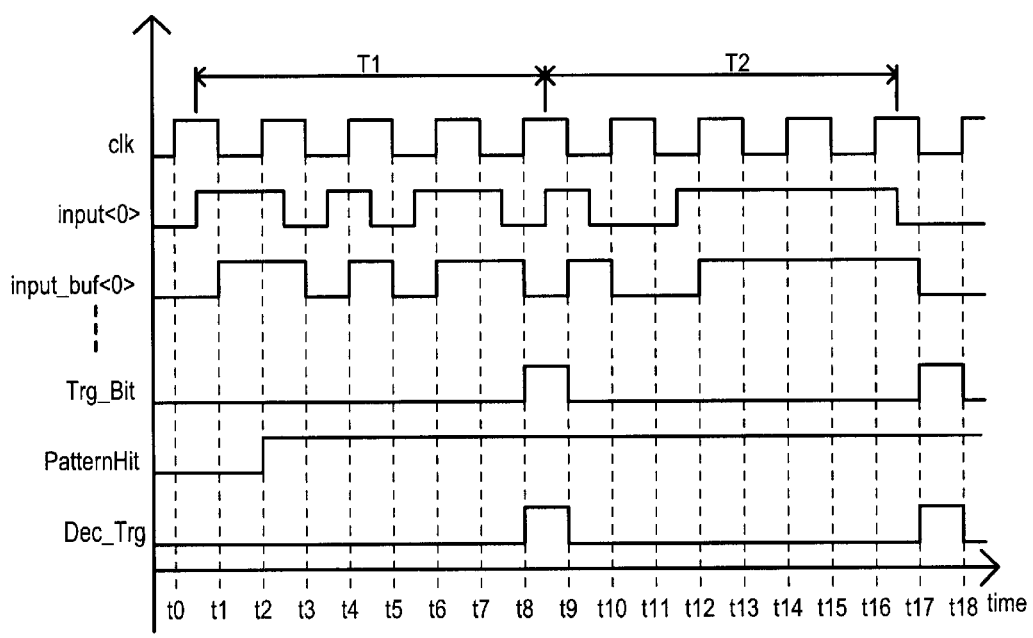
FIG. 5 is a timing diagram illustrating the operation of a trigger bit detection circuit and a pattern detection circuit according to an embodiment.

Referring now to FIG. 5, a timing diagram illustrating the operation of trigger bit detection circuit 6, pattern detection circuit 10, and AND gate 11 according to an embodiment is set forth.

The timing diagram of FIG. 5 can include clock signal clk, signal input<0>, signal input_buf<0>, signal Trg_Bit, signal PatternHit, and signal Dec_Trg.

Referring now to FIG. 5 in conjunction with FIG. 2, signal Trg_Bit is illustrated. Trigger bit detection circuit 6 may monitor whether or not signal input_buf<0> is high when a new packet of information may be received. Trigger bit detection circuit 6 may then generate a signal Trg_bit having a high level after seven clock cycles (edges) have occurred after detecting the initial high level of signal input_buf<0> becomes high when a new packet of information may be received. In this way, signal Trg_Bit may indicate that the complete packet of information has been received.

When semiconductor integrated circuit 50 operates in the ordinary operation mode, trigger bit detection circuit 6 may detect the head bit of a packet transmitted by signal group input_buf<5:0>. Trigger bit detection circuit 6 may then provide signal Trig_Bit having a high level when the final tail bit of that packet is received.

Signal input_buf<0> may become high when a new packet of information may be received to signal the head bit of a packet is being input. The pulse edge of clock signal clk in which signal input_buf<0> is high and the seven subsequent pulse edges of clock signal clk may constitute the eight pulse edges in which the packet of information has been received. Trigger bit detection circuit 6 may generate signal Trg_Bit having a high level when the tail bit (eighth bit) of the packet is received.

Referring once again to FIG. 5 in conjunction with FIG. 2, trigger bit detection circuit 6 may produce a signal Trg_Bit having a high level at time t8 to time t9. It is noted that the high edge of signal Trg_Bit may be in response to signal input_buf<0> being high at time t1. The high signal Trg_Bit in the time interval from t8 to t9 may indicate that a packet of information serially transmitted by signal input_buf<0> may be produced in parallel by status signals (stp0<0> to stp7<0>) during this time.

When semiconductor integrated circuit 50 operates in the test mode, trigger bit detection circuit 6 may be disabled.

When semiconductor integrated circuit 50 operates in the burn-in mode, signal Trg_Bit may operate in a similar manner indicating that a signal input_buf<0> having a high level has been received.

AND gate 7 may receive signal Trg_Bit generated by trigger bit detection circuit 6. AND gate 7 may also receive signals (TestMode and IF_Burnin) and may generate signal State_increment.

When semiconductor integrated circuit 50 operates in the ordinary operation mode, both signals (Testmode and IF_Burnin) may be low. Thus, when semiconductor integrated circuit 50 operates in the ordinary operation mode, signal State_increment may be low.

When semiconductor integrated circuit 50 operates in the test mode, signal IF_Burnin may be low. Thus, when semiconductor integrated circuit 50 operates in the test mode, signal State_increment may be low.

When semiconductor integrated circuit 50 operates in the burn-in mode, both signals (Testmode and IF_Burnin) may be high. Thus, when semiconductor integrated circuit 50 operates in the ordinary operation mode, signal State_increment may essentially the same as signal Trg_Bit.

Pattern generator 8 may receive signal Trg_Bit from AND gate 7. Pattern generator 8 may include a status pointer 8a. Status pointer 8a may hold a value of 0 to 255. Status pointer 8a may increment a held value by one every time signal State_increment transitions high. Status pointer 8a may wrap-around in that when status pointer 8a has a value of 255 and signal State_increment transitions high, the held value in status pointer 8a becomes zero.

When semiconductor integrated circuit 50 operates in the ordinary operation mode or test mode, signal State_increment may remain low at all times. Accordingly, when semiconductor integrated circuit 50 operates in the ordinary operation mode or test mode, the value stored in status pointer 8a may not change.

When semiconductor integrated circuit 50 operates in the burn-in mode, signal State_increment may transition high every time signal Trg_Bit transitions high. When signal Trg_Bit becomes high, this may indicate that trigger bit detection circuit 6 has detected a high signal input_buf<0>. Thus, status pointer 8a may increment every time trigger bit detection circuit 6 has detected a high signal input_buf<0>.

Pattern generator 8 may generate status signals (stt0<5:0> to stt7<5:0>) based on a value stored in status pointer 8a. Status signals (stt0<0> to stt0<5>) may be substantially the same. Likewise, status signals (sttj<0> to sttj<5>) may be substantially the same, where j may be an integer from zero to seven.

Referring to FIG. 6, a table illustrating the logic level of status signals (stt0<5:0> to stt7<5:0>) based on a value held by status pointer 8a according to an embodiment is set forth.

The table of FIG. 6 illustrates that when the value held by status pointer 8a is zero, a low level ("0") may be set for all status signals (stt0<i> to stt7<i>), where i may be a value between zero and five. When the value held by status pointer 8a is one, a high level ("1") may be set for status signal stt0<i> and a low level ("0") may be set for status signals (sttl<i> to stt7<i>).

Pattern generator 8 may generate status signals (stt0<i> to stt7<i>) satisfying the following equation:

$$\sum_{j=1}^{7} S_j \cdot 2^j = P \quad (1)$$

In equation (1), a value set to status signal sttj<i> is assumed to be $S_j$, where j is an integer ranging from zero to seven, and i is all integers from zero to five. The value held by status pointer 8a is P.

As previously described, status pointer 8a may have a stored value increased by one every time trigger bit detection circuit 6 detects that signal input_buf<0> is high. In this way, status signal groups (stt0<5:0> to stt7<5:0>) may change every time trigger bit detection circuit 6 detects that signal input_buf<0> is high.

Status signals (stt0<0> to stt0<5>) generated by pattern generator 8 may constitute status signal group stt0<5:0>. Similarly, status signals (sttj<0> to sttj<5>) generated by pattern generator 8 may constitute status signal group sttj<5:0>, where j is an integer ranging from zero to seven. Status signal groups (stt0<5:0> to stt7<5:0>) may be received by selector 5.

Selector 5 may select one of status signal groups (stt0<5:0> to stt7<5:0>) or status signal groups (stp0<5:0> to stp7<5:0>) in accordance with the value of signal IF_Burnin. When signal IF_Burnin is low and semiconductor integrated circuit 50 is operating in the ordinary operation mode, then selector may output status signal groups (stp0<5:0> to stp7<5:0>) as status signal groups (st0<5:0> to st7<5:0>). When signal IF_Burnin is high and semiconductor integrated circuit 50 is operating in the burn-in mode, then selector may output status signal groups (stt0<5:0> to stt7<5:0>) as status signal groups (st0<5:0> to st7<5:0>). It is noted that signal groups (stp0<5:0> to stp7<5:0>) may transmit data in parallel that has been received serially.

When semiconductor integrated circuit 50 operates in the ordinary operation mode, data serially transmitted by signal group input<5:0> may be substantially the same as data output in parallel as status signal group (st0<5:0> to st7<5:0>).

When semiconductor integrated circuit 50 operates in the test mode, selector 5 may be disabled.

When semiconductor integrated circuit 50 operates in the burn-in mode, signal IF_Burnin may be high and status signal groups (stt0<5:0> to stt7<5:0>) generated by generator 8 may be output as status signal groups (st0<5:0> to st7<5:0>).

Memory control circuit 9 may receive status signal groups (st0<5:0> to st7<5:0>).

Signal group input_buf<5:0> may also be received by pattern detection circuit 10. Pattern detection circuit 10 may also receive clock signal clk and signal IF_Burnin and may generate signal PatternHit based on the value of signal group input_buf<5:0> and signal IF_Burnin when clock signal clk transitions.

Signal PatternHit is a signal that may indicate whether or not memory control circuit 9 is enabled. When signal PatternHit is high, memory control circuit 9 may be enabled. When signal PatternHit is low, memory control circuit 9 may be disabled.

Pattern detection circuit 10 may operate in a different manner depending on the logic level of signal IF_Burnin.

The operation of pattern detection circuit 10 when signal IF_Burnin is low will now be described. When signal IF_Burnin is low, the semiconductor integrated circuit 50 may operate in the ordinary operation mode.

Pattern detection circuit 10 may judge whether or not signal group input<5:0> is to be received by semiconductor integrated circuit 50. As mentioned previously, signal line 3a through which signal group input<5:0> is input into input_buffer 3 may also be connected with another semiconductor integrated circuit (not shown) having a similar construction as semiconductor integrated circuit 50. Pattern detection circuit 10 may indicate whether data carried by signal group input<5:0> is intended for semiconductor integrated circuit 50.

Pattern detection circuit 10 may detect a predetermined pattern in signal group input<5:0>. If pattern detection circuit 10 detects the predetermined pattern in signal group input<5:0>, then pattern detection circuit 10 may generate a signal PatternHit having a high level for a predetermined time.

However, when pattern detection circuit 10 does not detect the predetermined pattern in signal group input<5:0>, then pattern detection circuit 10 may generate a signal PatternHit having a low level. In this case, whether data carried by signal group input<5:0> may be intended for another semiconductor integrated circuit (not shown).

Pattern detection circuit 10 may detect a head bit of a packet transmitted by signal (input_buf<0> to input_buf<5>) based upon signal input_buf<0>. When pattern detection circuit 10 detects the head bit of a packet based upon signal input_buf<0>, then the value of the head bits of packets based upon signals (input_buf<1> to input_buf<5>) may be examined for the predetermined pattern. When head bits of packets transmitted by signals (input_buf<1> to input_buf<5>) are low, high, high, low, and low, respectively, pattern detection circuit 10 may generate a signal PatternHit having a high level for a predetermined time. Otherwise, pattern detection circuit 10 may generate a signal PatternHit having a low level.

Although, pattern detection circuit 10 may detect a predetermined pattern in signal group input<5:0> in which head bits of packets transmitted by signals (input_buf<1> to input_buf<5>) are low, high, high, low, and low, respectively, this is just exemplary. Predetermined patterns that may be detected by pattern detection circuit 10 may differ. Also, pattern detection circuit 10 may detect patterns that are inputted in succession in time, as just one example.

Referring once again to FIG. 3 in conjunction with FIG. 2, the operation of pattern detection circuit 10 when signal group input_buf<5:0> is received will now be described. As illustrated in FIG. 3, signal input_buf<0> may become high from time t1 to time t2. Thus, pattern detection circuit 10 may recognize that the head bit of a packet is received at time t1. Pattern detection circuit 10 may then check the logic values of signals (input_buf<1> to input_buf<5>).

Signals (input_buf<1> to input_buf<5>) are low, high, high, low, and low, respectively, from time t1 to time t2. In this case, pattern detection circuit 10 decides that data in signal group input<5:0> is intended for semiconductor integrated circuit 50. Pattern detection circuit 10 brings signal PatternHit high from time t2 to t10.

Similarly, signal input_buf<0> may become high from time t9 to time t10. Thus, pattern detection circuit 10 may recognize that the head bit of a packet is received at time t9. Signals (input_buf<1> to input_buf<5>) are low, high, high, low, and low, respectively, from time t9 to time t10. Once again, pattern detection circuit 10 decides that data in signal group input<5:0> is intended for semiconductor integrated circuit 50. Pattern detection circuit 10 brings signal PatternHit high for a predetermined time period after time t10.

The operation of pattern detection circuit 10 when signal IF_Burnin is high (i.e. when semiconductor integrated circuit 50 operates in the burn-in mode) will now be described. When signal IF_Burnin is high, pattern detection circuit 10 may bring signal PatternHit to the high level irrespective as to the logic values of signal group input_buf<5:0>.

Thus, when semiconductor integrated circuit 50 operates in the burn-in mode, pattern detection circuit 10 may allow the operation of memory control circuit 9 at all times. When semiconductor integrated circuit 50 operates in the burn-in mode, it may be desirable to apply the burn-in stress to memory control circuit 9. Accordingly, when semiconductor integrated circuit 50 operates in the burn-in mode, memory control circuit 9 may be allowed to operate.

AND gate 11 may receive signal PatternHit from pattern detection circuit 10. AND gate 11 may also receive signal Trg_Bit and may generate signal Dec_Trg.

Memory control circuit 9 may receive signal Dec_Trg from AND gate 11. Memory control circuit 9 may also receive signal groups (st0<5:0> to st7<5:0>) and clock signal clk. When signal Dec_Trg is high, memory control circuit 9 may generate signal group CoreCntrl<5:0> from signal groups (st0<5:0> to st7<5:0>). When signal Dec_Trg is low, memory control circuit 9 may generate signal group CoreCntrl<5:0> all having a low level.

When semiconductor integrated circuit 50 operates in the ordinary operation mode, signal groups (st0<5:0> to st7<5:0>) may be generally the same as signal groups (stp0<5:0> to stp7<5:0>). As explained earlier, signal groups (stp0<5:0> to stp7<5:0>) may contain parallel data indicative of a packet of serial data from signal group input<5:0>. In this way, signal groups (st0<5:0> to st7<5:0>) may have values determined by data from signal group input<5:0>. Thus, when semiconductor integrated circuit 50 operates in the ordinary operation mode, memory control circuit 9 may operate based on data from signal group input<5:0>.

When semiconductor integrated circuit 50 operates in the test mode, signal groups (st0<5:0> to st7<5:0>) may all have low logic values and memory control circuit 9 may be disabled and may not substantially operate.

When semiconductor integrated circuit 50 operates in the burn-in mode, signal groups (st0<5:0> to st7<5:0>) may be generally the same as signal groups (stt0<5:0> to stt7<5:0>). Signal groups (stt0<5:0> to stt7<5:0>) may be generated by pattern generator 8. Thus, when semiconductor integrated circuit 50 operates in the burn-in mode, memory control circuit 9 may operate based on data generated from pattern generator 8.

Memory control circuit 9 may generate signal group CoreCntrol<5:0>. Signal group CoreCntrol<5:0> may be received by selector 12. Selector 12 may also receive signal group input<5:0> and signal TestMode. When signal TestMode is low, selector 12 may output signal group CoreCntrol<5:0> to memory 14 as signal group Cntrol<5:0>. When signal TestMode is high, selector 12 may output signal group input<5:0> to memory 14 as signal group Cntrol<5:0>.

When signal TestMode is low, semiconductor integrated circuit 50 may operate in the ordinary operation mode. In this case, memory 14 may operate in response to substantially the same signal group as signal group CoreCntrol<5:0> generated by memory control circuit 9.

When signal TestMode is high, semiconductor integrated circuit 50 may operate in the test mode or in the burn-in mode. In this case, memory 14 may operate in response to substantially the same signal group as signal group input<5:0>.

As described above, respective portions included in semiconductor integrated circuit 50 may operate in a different manner in response to the ordinary operation mode, test mode, or burn-in mode. As a result, semiconductor integrated circuit 50 may operate in a different manner depending on being set in the ordinary operation mode, test mode, or burn-in mode.

As described above, when semiconductor integrated circuit 50 is in the ordinary operation mode, memory control circuit 9 may operate memory 14 in response to data values received by semiconductor integrated circuit 50 via signal group input<5:0>. Such an operation of semiconductor integrated circuit 50 will now be explained.

Input buffer 3 may receive serially transmitted data by way of signal group input<5:0>. When semiconductor integrated circuit 50 is in the ordinary operation mode, memory control circuit 9 may be controlled by data values of signal group input<5:0>. Signal group input<5:0> may include a predetermined pattern, which may allow memory control circuit 9 to become enabled.

Figure 7:
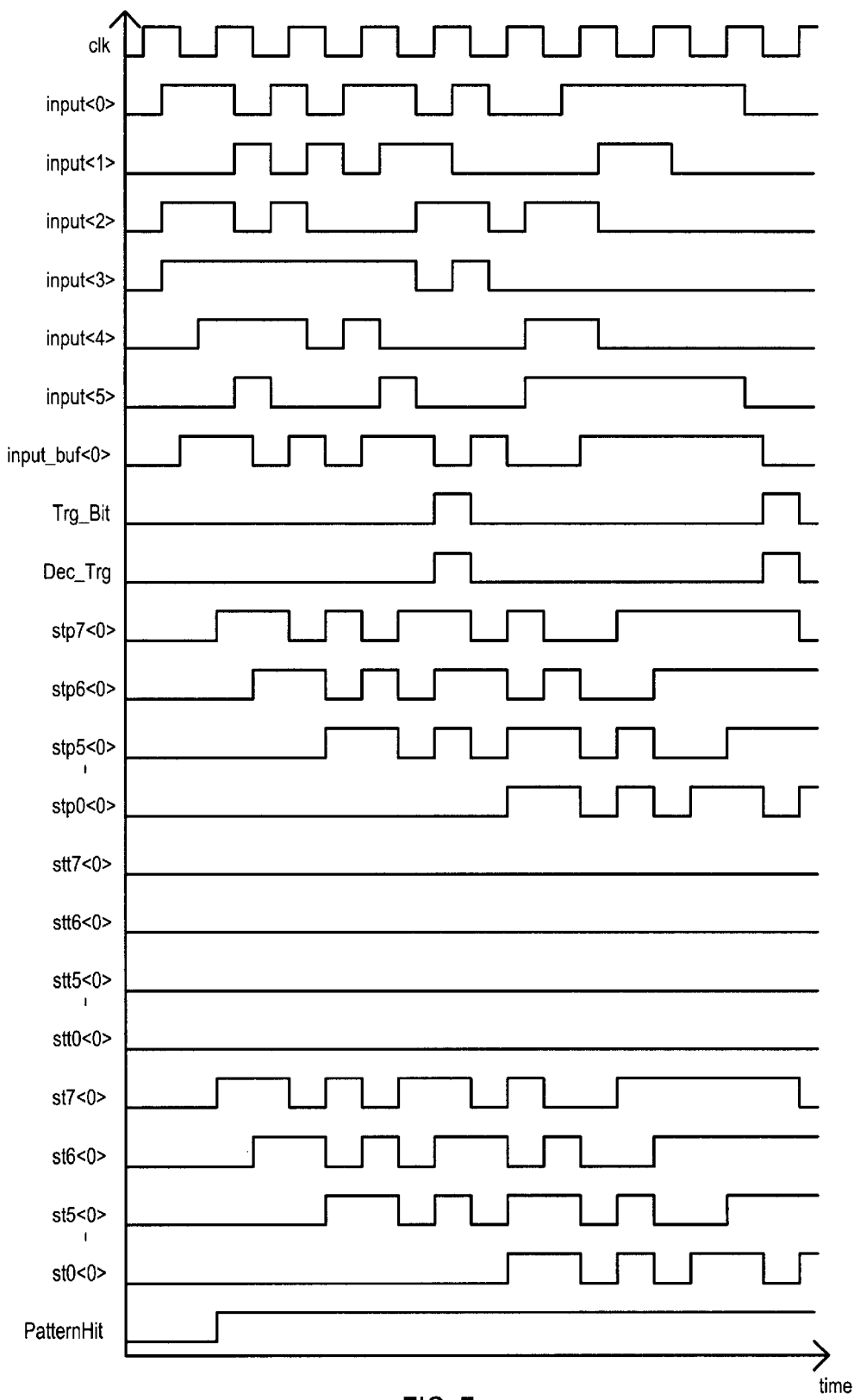
FIG. 7 is a timing diagram illustrating the operation of a semiconductor integrated circuit in the ordinary operation mode according to an embodiment.

Referring now to FIG. 7, a timing diagram illustrating the operation of semiconductor integrated circuit 50 in the ordinary operation mode according to an embodiment is set forth.

The timing diagram of FIG. 7 can include clock signal clk, signals (input<0> to input<5>), signal input_buf<0>, signal Trg_Bit, signal Dec_Trg., status signals (stp7<0>, stp6<0>, stp5<0>, and stp0<0>), status signals (stt7<0>, stt6<0>, stt5<0>, and stt0<0>), status signals (st7<0>, st6<0>, st5<0>, and st0<0>), and signal PatternHit.

Referring now to FIG. 7 in conjunction with FIG. 2, signals (input<0> to input<5>) may transmit data in a serial manner. Input buffer 3 may receive signal group input<5:0> and synchronously transmit signal group input_buf<5:0> to shift register 4.

Shift register 4 may convert serially transmitted data from signal group input_buf<5:0> into a parallel format. In this way, status signal groups (stp0<5:0> to stp7<5:0>) may transmit data in a parallel fashion. Signals (stp0<0> to stp7<0>) may include a packet of data from signal input<0>. Signals (stp0<1> to stp7<1>) may include a packet of data from signal input<1>. Signals (stp0<2> to stp7<2>) may include a packet of data from signal input<2>. Signals (stp0<3> to stp7<3>) may include a packet of data from signal input<3>. Signals (stp0<4> to stp7<4>) may include a packet of data from signal input<4>. Signals (stp0<5> to stp7<5>) may include a packet of data from signal input<5>. In this way, status signal groups (stp0<5:0> to stp7<5:0>) may have substantially the same data as transmitted from signal group input<5:0> and signal group input_buf<5:0>.

Selector 5 may receive status signal groups (stp0<5:0> to stp7<5:0>) from shift register 4. In the ordinary operation mode, selector 5 may generate status signal groups (st0<5:0> to st7<5:0>) having essentially the same value as status signal groups (stp0<5:0> to stp7<5:0>) generated by shift register 4. However, in the burn-in mode, selector 5 may generate status signal groups (st0<5:0> to st7<5:0>) having essentially the same value as status signal groups (stt0<5:0> to stt7<5:0>) generated by pattern generator 8.

Trigger bit detection circuit 6 may continuously monitor signal input_buf<0>. When trigger bit detection circuit 6 detects that signal input_buf<0> is high, it may be determined that a head bit of a packet being received. Then, after are predetermined number of clock cycles, trigger bit detection circuit 6 may generate a signal TrgBit at a high level when a tail bit of the packet is being received. When signal TrgBit is high, a complete packet of data has been received and memory control circuit 9 may be enabled.

Pattern detection circuit 10 can detect whether or not a predetermined pattern has been received on signal group input_buf<5:0>. If the predetermined pattern is detected, signal PatternHit becomes high for a predetermined time period. When signal PatternHit is high, AND gate 11 may be enabled to generate signal Dec_Trg when signal TrgBit becomes high. However, if the predetermined pattern is not detected, signal PatternHit remains low and AND gate 11 may be disabled and signal Dec_Trg may remain low. In this way, memory control circuit 9 may be disabled.

Signal Dec_Trg may be high when both signals (TrgBit and PatternHit) are high.

When signal Dec_Trg becomes high, memory control circuit 9 may generate signal group CoreCntrol<5:0> based upon status signal groups (st0<5:0> to st7<5:0>).

Selector 12 may receive signal group CoreCntrol<5:0> and signal group input<5:0> and may generate signal group Cntrl<5:0>. When semiconductor integrated circuit 50 is in the ordinary operation mode, signal TestMode may be low and selector 12 may generate signal group Cntrl<5:0> based on signal group CoreCntrol<5:0>. Memory 14 may receive and may be controlled by signal group Cntrl<5:0>.

Figure 8:
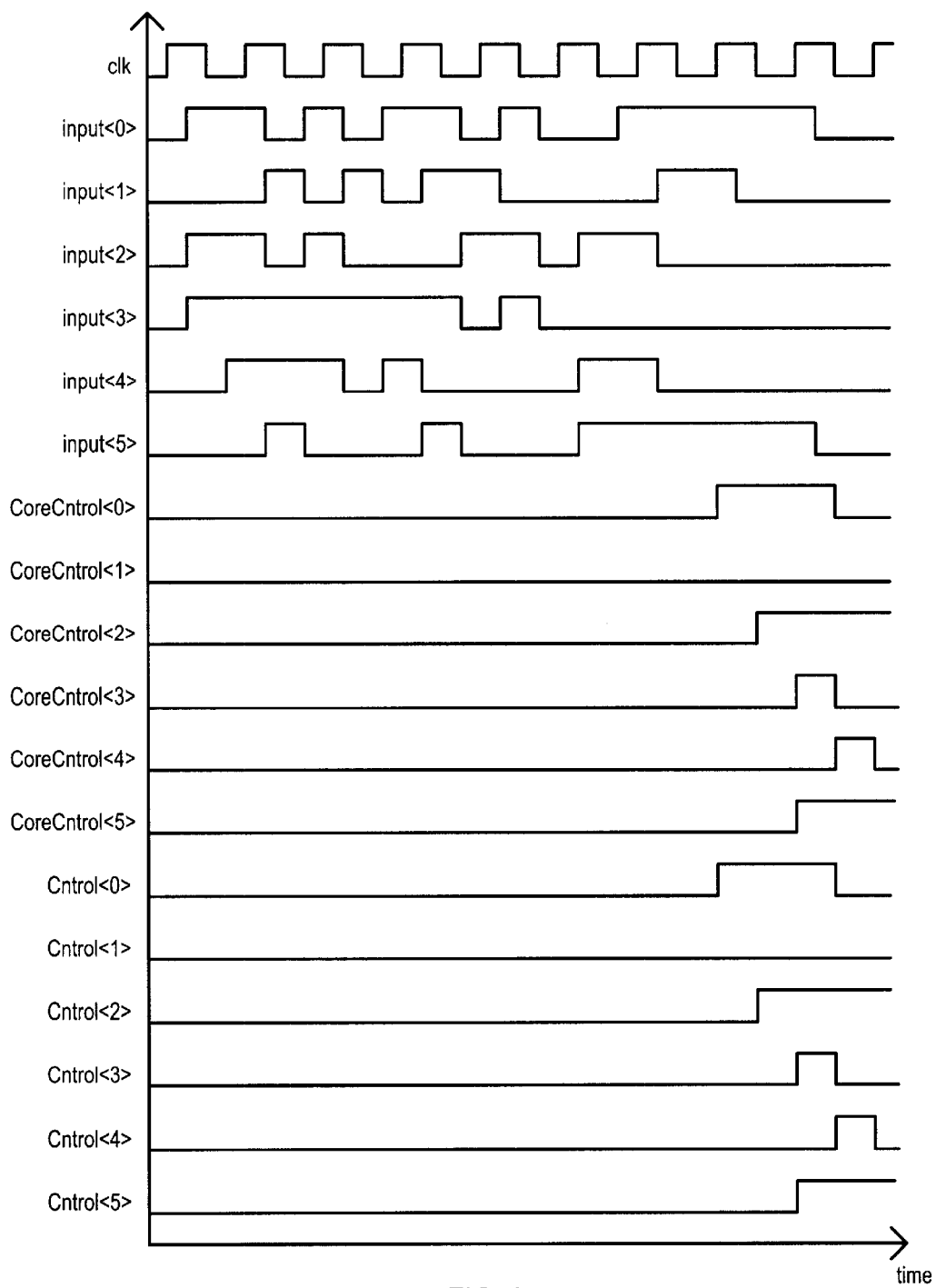
FIG. 8 is a timing diagram illustrating the operation of a semiconductor integrated circuit in the ordinary operation mode according to an embodiment.

Referring now to FIG. 8, a timing diagram illustrating the operation of semiconductor integrated circuit 50 in the ordinary operation mode according to an embodiment is set forth.

The timing diagram of FIG. 8 can include clock signal clk, signals (input<0> to input<5>), signals (CoreCntrol<0> to CoreCntrol<5>), and signals (Cntrl<0> to Cntrl<5>).

Referring now to FIG. 8 in conjunction with FIG. 2, signal group CoreCntrol<5:0> may be substantially the same as signal group Cntrol<5:0>. In this way, memory 14 may operate in response to signal group Cntrol<5:0> having substantially the same values as signal group CoreCntrol<5:0> generated by memory control circuit 9.

When semiconductor integrated circuit 50 is in the ordinary operation mode, signal groups (stp0<5:0> to stp7<5:0>) may be substantially the same as signal groups (st0<5:0> to st7<5:0>) input into control signal. Signal groups (st0<5:0> to st7<5:0>) may carry the same data received serially by semiconductor integrated circuit 50 by way of signal group input<5:0>. In this way, memory control circuit 9 may be controlled by signal group input<5:0>. Memory 14 may operate in response to signal group CoreCntrol<5:0> generated by memory control circuit 9.

As described above, when semiconductor integrated circuit 50 is in the ordinary operation mode, memory control circuit 9 may be controlled by signal group input<5:0> and memory 14 may operate as controlled by memory control circuit 9.

As described previously, when semiconductor integrated circuit 50 is in the test mode, memory control circuit 9 may be disabled and memory 14 may operate directly in response to signal group input<5:0>.

The operation of semiconductor integrated circuit 50 in a test mode will now be summarized.

When semiconductor integrated circuit 50 is in the test mode, input buffer 3 may be disabled. The operation of shift register 4, selector 5, trigger bit detection circuit 6, AND gate 7, pattern generator 8, memory control circuit 9, pattern detection circuit 10, and AND gate 11 may be disabled or interrupted.

Selector 12 may output group signal Cntrol<5:0>, which may be substantially the same as group signal input<5:0>. Memory 14 may operate in response to signal group Cntrol<5:0>.

Thus, when semiconductor integrated circuit 50 is in the test mode, memory control circuit 9 may be disabled and memory 14 may operate in direct response to signal group input<5:0>.

Also, as previously described, when semiconductor integrated circuit 50 is in the burn-in mode, memory 14 may operate in response to signal group input<5:0> and memory control circuit 9 may operate in response to status signal groups (stt0<5:0> to stt7<5:0>), which may be generated by pattern generator 8 in response to a beginning packet bit from signal group input<5:0>.

The operation of semiconductor integrated circuit 50 when in the burn-in mode will now be described.

Figure 9:
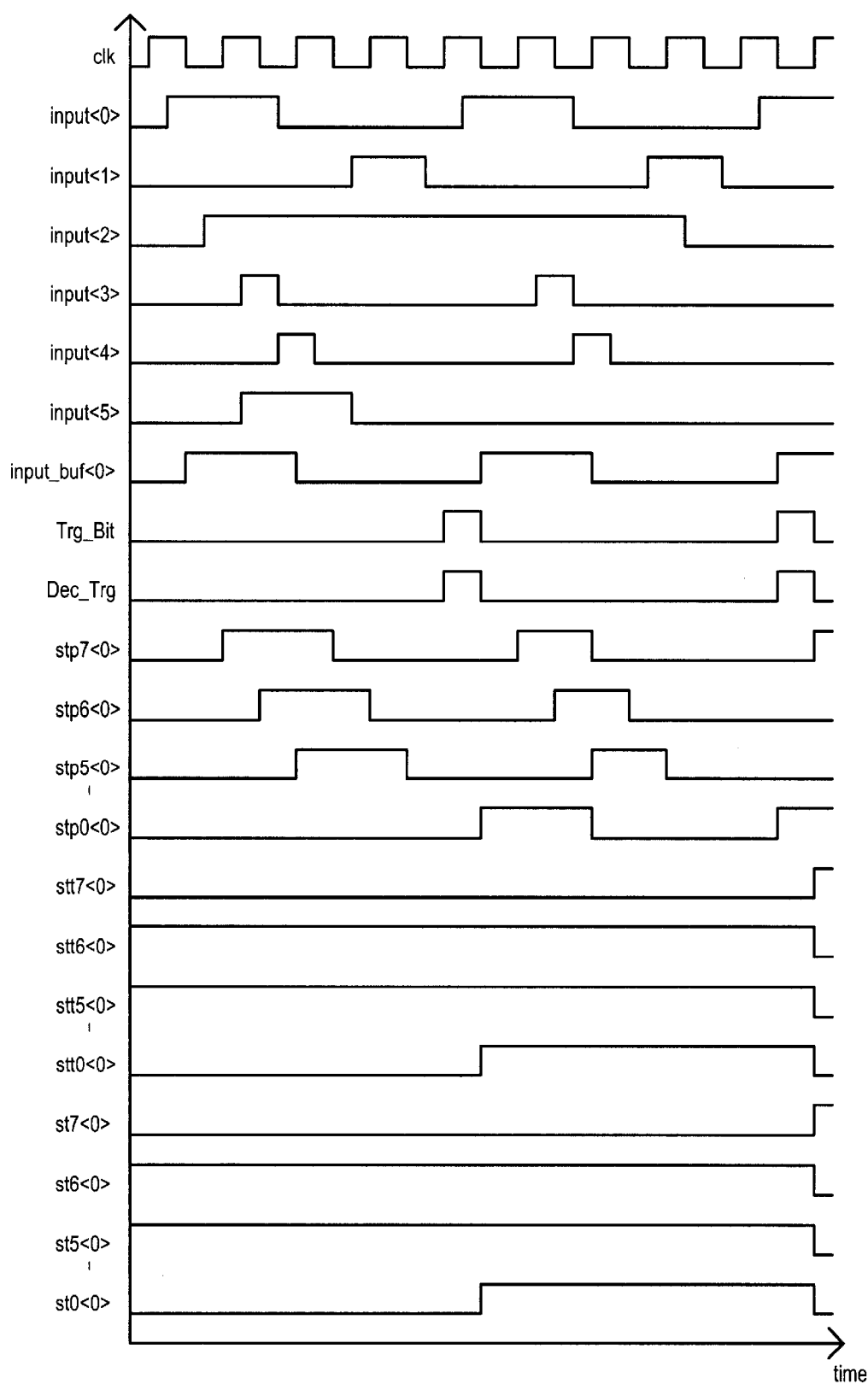
FIG. 9 is a timing diagram illustrating the operation of a semiconductor integrated circuit in the burn-in mode according to an embodiment.

Referring now to FIG. 9, a timing diagram illustrating the operation of semiconductor integrated circuit 50 in the burn-in mode according to an embodiment is set forth.

The timing diagram of FIG. 9 can include clock signal clk, signals (input<0> to input<5>), signal input_buf<0>, signal Trg_Bit, signal Dec_Trg, status signals (stp7<0>, stp6<0>, stp5<0>, and stp0<0>), status signals (stt7<0>, stt6<0>, stt5<0>, and stt0<0>), and status signals (st7<0>, st6<0>, st5<0>, and st0<0>).

Referring now to FIG. 9 in conjunction with FIG. 2, input buffer 3 may receive signal group input<5:0>. Signal group input<5:0> may be signals for controlling memory 14. Signal group input<5:0> may not include a predetermined pattern that can enable operation of memory control circuit 9.

Input buffer synchronously sample signal group input<5:0> to provide signal group input_buf<5:0>. Shift register 4 may receive signal group input_buf<5:0> and may operate in a similar manner as in the ordinary operation mode.

Trigger bit detection circuit 6 may synchronously monitor signal input_buf<0> and may provide signal Trg_Bit having a high level for a predetermined time when a high signal input_buf<0> is detected. It is noted that although trigger bit detection circuit 6 may detect the front bit of a packet of data, signal Trg_Bit may transition high when the tail bit of a packet of data is received. Because semiconductor integrated circuit 50 is in the burn-in mode, AND gate 7 may provide a signal State_Increment having a high level when signal Trg_Bit has a high level.

Status pointer 8a included in pattern generator 8 may increment a stored value by one every time signal State_Increment becomes high. Pattern generator 8 may generate status signal groups (stt0<5:0> to stt7<5:0>) in accordance with the stored value held by status pointer 8a. The value of status signal groups (stt0<5:0> to stt7<5:0>) may be different for different stored values held in status pointer 8a. Pattern generator 8 may change the value of status signal groups (stt0<5:0> to stt7<5:0>) every time trigger bit detection circuit 6 detects a high value on signal input_buf<0>. It may be desirable that signal input_buf<0> has a high value in a proper time interval.

Because semiconductor integrated circuit 50 is in the burn-in mode, selector 5 may provide status signal groups (stt0<5:0> to stt7<5:0>) to memory control circuit 9 as status signal groups (st0<5:0> to st7<5:0>).

Because semiconductor integrated circuit 50 is in the burn-in mode, pattern detection circuit 10 may provide a signal PatternHit having a high level regardless as to the value of signal group input_buf<5:0>. Thus, in the burn-in mode, pattern detection circuit 10 may allow memory control circuit 9 to operate regardless as to whether signal group input_buf<5:0> has the predetermined pattern needed in the ordinary operation mode. In this way, a plurality of similar semiconductor integrated circuits may be evaluated in parallel under burn-in conditions without the need to separately address them. This can improve burn-in test time and reduce burn-in test complexity.

With signal PatternHit having a high level, signal Dec_Trg may become high when signal TrgBit is high and memory control circuit 9 may be enabled.

When memory control circuit 9 receives signal Dec_Trg having a high level, signal group CoreCntrl<5:0> may be generated in response to status signal groups (stt0<5:0> to stt7<5:0>).

Selector 12 may receive signal group CoreCntrl<5:0> and signal group input<5:0>. Because semiconductor integrated circuit 50 is in the burn-in mode, signal TestMode may be high and selector 12 may output signal group Cntrol<5:0>, which may be substantially the same as signal group input<5:0>. In this way, memory 14 may be controlled directly by signal group input<5:0> in the burn-in mode.

Figure 10:
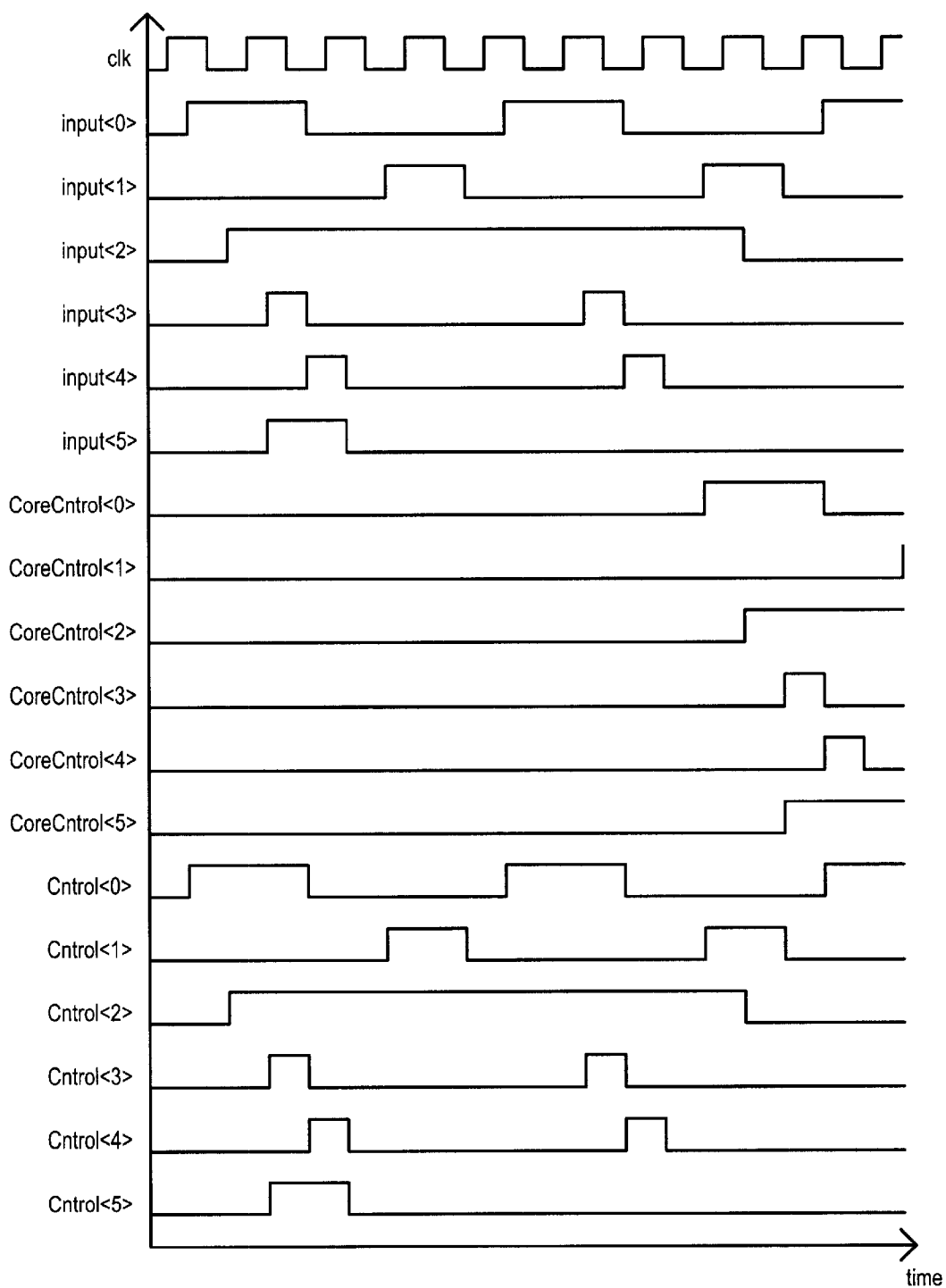
FIG. 10 is a timing diagram illustrating the operation of a semiconductor circuit in the burn-in mode according to an embodiment.

Referring now to FIG. 10, a timing diagram illustrating the operation of semiconductor circuit 50 in the burn-in mode according to an embodiment is set forth.

The timing diagram of FIG. 9 can include clock signal clk, signals (input<0> to input<5>), signals (CoreCntrol<0> to CoreCntrol<5>), and signals (Cntrol<0> to Cntrol<5>).

Referring now to FIG. 10 in conjunction with FIG. 2, when signal TestMode is high, selector 12 may output signal group Cntrol<5:0>, which may be substantially the same as signal group input<5:0>. In this way, memory 14 may be controlled directly by signal group input<5:0> in the burn-in mode.

At the same time, selector 5 may provide status signal groups (stt0<5:0> to stt7<5:0>) to memory control circuit 9 by way of status signal groups (st0<5:0> to st7<5:0>). In this way, memory control circuit 9 may receive the burn-in stress and may generate group signal CoreCntrol<5:0> under burn-in conditions.

When semiconductor integrated circuit 50 is in the burn-in mode, memory control circuit 9 may be operated regardless as to the data values or pattern of signal group input<5:0>. Signal group input<5:0> may be applied directly to control memory 14. semiconductor integrated circuit 50 is in the burn-in mode, trigger bit detection circuit 6, AND gate 7, pattern generator 8, pattern detection circuit 10, and AND gate 11 may collectively function to generate status signal groups (stt0<5:0> to stt7<5:0>) and signal Dec_Trg in order to control memory control circuit 9. Status signal groups (stt0<5:0> to stt7<5:0>) and signal Dec_Trg may be generated in response to a value of at least one of group signal input<5:0>(in this example, signal input<0>).

Thus, when in the burn-in mode, semiconductor integrated circuit 50 may have all circuits including memory circuit 14 and logic circuits (for example, circuits 1 to 11) may operate in response to signal group input<5:0> being received. In this way, memory circuit 14 and all other circuits included on semiconductor integrated circuit 50 may be simultaneously burned in.

It is understood that the embodiments described above are exemplary and the present invention should not be limited to those embodiments. Specific structures should not be limited to the described embodiments.

Various modes of operation may be entered by receiving predetermined combinations of control, address, data signal, or predetermined signal potentials (such as an over-voltage potential), as just a few examples.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor integrated circuit having a burn-in mode and an ordinary operation mode, comprising:
   a memory operable in response to a plurality of input signals and not in response to control signals when the semiconductor integrated circuit is in the burn-in mode;
   a logic generator circuit providing the control signals in response to at least one of the plurality of input signals when the semiconductor integrated circuit is in the burn-in mode; and
   a logic circuit operating in response to the control signals.

2. The semiconductor integrated circuit according to claim 1, wherein when the semiconductor integrated circuit is in the ordinary operation mode:
   the logic generator circuit provides control signals having logic values dependent on the logic value of the plurality of input signals;
   the logic circuit provides at least one memory control signal in response to the control signals; and
   the memory is operated in response to the at least one memory control signal.

3. The semiconductor integrated circuit according to claim 2, further including:
   a pattern detection circuit coupled to receive the plurality of input signals and generate a logic circuit enable signal having a logic circuit enable state and a logic circuit disable state wherein during the normal operation mode the logic circuit enable signal has the logic circuit enable state in response to the pattern detection circuit detecting a predetermined pattern in the plurality of input signals.

4. The semiconductor integrated circuit according to claim 3, wherein:
   the logic circuit enable signal has the logic circuit enable state when the semiconductor integrated circuit is in the burn-in mode.

5. The semiconductor integrated circuit according to claim 1, wherein:
   the plurality of input signals are digital signals each having a logic value; and
   when the semiconductor integrated circuit is in the burn-in mode the logic generator circuit periodically detects the logic value of at least one of the plurality of input signals and changes the logic value of the control signals if the logic value of the at least one of the plurality of input signals is a predetermined logic value.

6. The semiconductor integrated circuit according to claim 5, wherein:

the logic circuit includes a pattern generator that changes the logic value of the control signals if the logic value of a predetermined one of the plurality of input signals has the predetermined logic value.

7. A method of operating a semiconductor integrated circuit capable of operating in a burn-in mode and an ordinary operation mode, comprising the steps of:

receiving an input signal;

operating a memory in response to the input signal and not a logic circuit operation signal during the burn-in mode;

generating the logic circuit operation signal based on the input signal during the burn-in mode; and operating a logic circuit in response to the logic circuit operation signal.

8. The method of operating the semiconductor integrated circuit according to claim 7, further including the steps of:

generating a logic circuit control signal having a value substantially the same as the value of the input signal during the ordinary operation mode;

operating the logic circuit in response to the logic circuit control signal and outputting a memory control signal; and operating the memory in response to the memory control signal.

9. The method of operating the semiconductor integrated circuit according to claim 8, further including the steps of:

generating a logic circuit allowance signal for instructing whether or not operation of the logic circuit is allowed.

10. The method of operating the semiconductor integrated circuit according to claim 9, wherein the step of generating the logic circuit allowance signal further includes the steps of:

generating the logic circuit allowance signal such that operation of the logic circuit is allowed during the burn-in mode;

detecting whether or not a predetermined pattern is included in the input signal during the ordinary operation mode;

generating the logic circuit allowance signal such that operation of the logic circuit is allowed when the predetermined pattern is included in the input signal during the ordinary operation mode; and generating the logic circuit allowance signal such that operation of the logic circuit is prohibited when the predetermined pattern is not included in the input signal during the ordinary operation mode.

11. A semiconductor integrated circuit having a stress test mode and an ordinary operation mode, comprising:

a memory circuit operable in response to a group of input signals when the semiconductor integrated circuit is in the stress test mode;

a logic generator circuit coupled to provide control signals in response to at least one of the input signals from the group of input signals when the semiconductor integrated circuit is in the stress test mode;

a logic circuit coupled to operate in response to the control signals; and the logic circuit is coupled to provide memory control signals when the semiconductor integrated circuit is in the ordinary operation mode.

12. The semiconductor integrated circuit according to claim 11, wherein:

the logic generator circuit includes a trigger bit detection circuit coupled to provide a trigger signal in response to at least one of the input signals from the group of input signals; and the logic generator circuit modifies a logic value of at least one of the control signals in response to the trigger signal when the semiconductor integrated circuit is in the stress test mode.

13. The semiconductor integrated circuit according to claim 12, wherein:

the logic generator circuit includes a pattern generator circuit coupled to generate the control signals in response to the trigger signal when the semiconductor integrated circuit is in the stress test mode.

14. The semiconductor integrated circuit according to claim 13, wherein:

the pattern generator circuit includes a status pointer circuit coupled to increment a stored status value in response to the trigger signal when the semiconductor integrated circuit is in the stress test mode.

15. The semiconductor integrated circuit according to claim 11, further including:

a pattern detection circuit coupled to generate a pattern hit signal having a pattern detected state in response to the group of input signals having a predetermined pattern when the semiconductor integrated circuit is in the ordinary operation mode and when the pattern hit signal has the pattern detected state the logic circuit is allowed to operate in response to the control signals.

16. The semiconductor integrated circuit according to claim 15, wherein:

the pattern hit signal has the pattern detected state regardless as to whether the group of input signals have the predetermined pattern when the semiconductor integrated circuit is in the stress test mode.

17. The semiconductor integrated circuit according to claim 11, wherein:

the group of input signals provide data in a serial fashion and the logic generator circuit further includes
a serial to parallel conversion circuit coupled to convert the group of input signals into parallel signals to provide the control signals when the semiconductor integrated circuit is in the ordinary operation mode.

18. The semiconductor integrated circuit according to claim 11, further including:

a first test mode;

the logic circuit is disabled in the first test mode; and the memory circuit is operable in response to the group of input signals when the semiconductor integrated circuit is in the first test mode.

19. The semiconductor integrated circuit according to claim 11, wherein:

the stress test mode is a burn-in test mode.

* * * * *